(12) United States Patent  
Albert et al.

(10) Patent No.: US 11,034,244 B2  
(45) Date of Patent: *Jun. 15, 2021

(54) SYSTEM AND METHOD FOR CONTROLLING THE ENERGIZATION OF AN ELECTRICAL LOAD OF A VEHICLE

(71) Applicant: Fico Triad, S.A., Barcelona (ES)

(72) Inventors: Adriá Torné Albert, Barcelona (ES); Enric Sala Masip, Manresa (ES)

(73) Assignee: FICO TRIAD, S.A., Barcelona (ES)

( * ) Notice: Subject to any disclaimer, the term of this patent is extended or adjusted under 35 U.S.C. 154(b) by 274 days.

This patent is subject to a terminal disclaimer.

(21) Appl. No.: 16/189,361

(22) Filed: Nov. 13, 2018

(65) Prior Publication Data

US 2019/0077266 A1   Mar. 14, 2019

Related U.S. Application Data

(63) Continuation of application No. 15/271,814, filed on Sep. 21, 2016, now Pat. No. 10,160,327.

(30) Foreign Application Priority Data

Sep. 22, 2015   (EP) .................................... 15382457

(51) Int. Cl.
*B60L 3/00*     (2019.01)
*G01R 27/02*    (2006.01)
(Continued)

(52) U.S. Cl.
CPC ........... *B60L 3/0069* (2013.01); *B60L 3/0046* (2013.01); *B60L 50/62* (2019.02); *G01R 27/025* (2013.01);
(Continued)

(58) Field of Classification Search
CPC .... G01R 31/50; G01R 27/025; G01R 31/007; B60L 3/0046; B60L 2240/547;
(Continued)

(56) References Cited

U.S. PATENT DOCUMENTS

2007/0008666 A1   1/2007   Morita et al.
2012/0280697 A1   11/2012  Morimoto
2015/0022219 A1   1/2015   Kawamura

FOREIGN PATENT DOCUMENTS

CN   102969887 A   3/2013
CN   103308769 A   9/2013
(Continued)

OTHER PUBLICATIONS

Extended European Search Report for European Application No. 15382457.8; Date of Completion: Mar. 31, 2016; dated Apr. 20, 2016; 5 Pages.

*Primary Examiner* — Michael D Lang
(74) *Attorney, Agent, or Firm* — Cantor Colburn LLP

(57) ABSTRACT

A system and method for assisting the start of an electrically powered vehicle comprising processing circuitry configured to: a) receive a sensory signal indicative of a sequence of voltage measurements during an initial ramp state, b) compare the sequence of voltage measurements with a previously established plurality of voltage patterns, c) select a voltage pattern whose voltage values are closest to the voltage values of the sequence of voltage measurements received from the sensor, d) establish the insulation resistance value of the battery from selected voltage pattern, and e) enable electrically energizing a load indicative of vehicle start if the insulation resistance value obtained exceeds a predetermined insulation resistance threshold value that ensures the insulation of the battery.

20 Claims, 8 Drawing Sheets

(51) Int. Cl.
   *B60L 50/62*   (2019.01)
   *G01R 31/50*   (2020.01)
   *G01R 31/00*   (2006.01)

(52) U.S. Cl.
   CPC ........ *G01R 31/50* (2020.01); *B60L 2240/547* (2013.01); *B60L 2240/80* (2013.01); *B60L 2260/26* (2013.01); *G01R 31/007* (2013.01); *Y02T 10/62* (2013.01); *Y02T 10/70* (2013.01); *Y02T 10/7072* (2013.01)

(58) Field of Classification Search
   CPC .. B60L 2240/80; B60L 2260/26; Y02T 10/62; Y02T 10/70; Y02T 10/7072
   See application file for complete search history.

(56) References Cited

FOREIGN PATENT DOCUMENTS

| | | |
|---|---|---|
| KR | 1020140068567 A | 6/2014 |
| WO | 2014086381 A1 | 6/2014 |

SYSTEM AND METHOD FOR CONTROLLING THE ENERGIZATION OF AN ELECTRICAL LOAD OF A VEHICLE

CROSS-REFERENCES TO RELATED APPLICATIONS

This patent application claims priority to U.S. patent application Ser. No. 15/271,814, filed Sep. 21, 2016, that claims priority to European Application No. EP15382457.8, filed Sep. 22, 2015, both of which are incorporated herein by reference in their entirety.

BACKGROUND

The present disclosure relates to a system and method for controlling the energization of an electrical load of a vehicle. More particularly, the disclosure relates to a system and method configured to obtain an insulation resistance value of a vehicle battery.

Improving safety and comfort is always a concern in the automotive industry. For electrically powered vehicles, such as electric or hybrid powered vehicles, insulation of the high voltage battery is of significant importance to guarantee safety of the entire vehicle and its occupants. For that, electrically powered vehicles demand applications that check whether the insulation level of the battery is adequate or not before performing specific tasks, such as starting the vehicle.

The start of an electrically powered vehicle is a potentially problematic task and could pose a risk for the occupants, or even the vehicle itself, if the battery is poorly insulated.

Because of this, and before enabling the start of the vehicle, it is desirable to measure the resistance between the high voltage lines and the chassis. From this measurement, the insulation level of the battery can be determined, and depending upon this determination, starting of the vehicle can be enabled or disabled.

Currently, there exist commercial sensors capable of providing this measurement. However, on average, sensors of this kind usually require about two seconds to obtain a rough measurement and about twenty seconds to obtain a definite value. The two second time measurement just provides an indication in the event of very serious isolation fault. Thus, in order to ensure safety in the use of electric vehicles, a driver has to wait a considerable time before the vehicle actually starts. This time corresponds with the time needed by the sensor to obtain the definite insulation resistance value.

This starting delay reduces driving comfort.

Therefore, it would be desirable in the electrically powered vehicle industry to develop an improved system and method capable of reducing this vehicle starting delay while ensuring safety of such start.

SUMMARY

In one exemplary, non-limiting, embodiment of the present disclosure, the system overcomes the above mentioned drawbacks by providing a system that enables a quick start without frustrating either the vehicle or the driver.

The system and method are capable of offering a quick start by reducing the time conventionally required for testing the insulation resistance of the battery.

The system and method are capable of guaranteeing a safe start for both the driver and the vehicle.

The system and method are capable of simplifying obtainment of the insulation resistance value that, at the same time, provides a reliable value.

The system assists the start of an electrically powered vehicle that comprises a battery for powering the vehicle, and processing circuitry which are configured to:

a) receive a sequence of voltage measurements ($x_{i0}$, $x_{i1}$, $x_{i2}$, . . . ; $0 \le i \le n$) measured by a sensor connected between the high voltage terminals of the battery and a vehicle chassis;

b) compare the sequence of voltage measurements ($x_{i0}$, $x_{i1}$, $x_{i2}$, . . . ; $0 \le i \le n$) received from the sensor with previously established voltage patterns (P0, P1, P2, . . . ), wherein each voltage pattern (P0, P1, P2, . . . ) is formed by a sequence of voltage values ($p_{i0}$, $p_{i1}$, $p_{i2}$, . . . ; $0 \le i \le n$), and wherein each voltage pattern (P0, P1, P2, . . . ) is associated to an insulation resistance value (Ri; $0 \le i \le n$);

c) select the voltage pattern (Pi; $0 \le i \le n$) whose voltage values ($p_{i0}$, $p_{i1}$, $p_{i2}$, . . . ; $0 \le i \le n$) are closest to the voltage values of the sequence of voltage measurements ($x_{i0}$, $x_{i1}$, $x_{i2}$, . . . ; $0 \le i \le n$) received from the sensor;

d) establish the insulation resistance value (Ri; $0 \le i \le n$) associated to the selected voltage pattern (P0, P1, P2, . . . ) as the insulation resistance value of the battery; and e) enable starting of the vehicle if the insulation resistance value obtained exceeds a predetermined insulation resistance threshold value that ensures insulation of the battery.

The system 1 allows obtaining the insulation resistance value associated to the measurements ($x_{i0}$, $x_{i1}$, $x_{i2}$, . . . ; $0 \le i \le n$) obtained by the sensor by just comparing the sensor measurements ($x_{i0}$, $x_{i1}$, $x_{i2}$, . . . ; $0 \le i \le n$) with the voltage values ($p_{i0}$, $p_{i1}$, $p_{i2}$, . . . ; $0 \le i \le n$) of each one of the patterns (P0, P1, P2, . . . ), and then, selecting the closest pattern to the received measurements.

Providing these patterns, the system 1 enables obtaining an insulation resistance value quickly, without having to wait for the sensor to obtain a definite value. This waiting is no longer needed since each pattern has an associated insulation resistance value. Thus, the insulation resistance value is obtained by selection of the pattern. Hence, the system 1 offers a quick start by reducing the delay before starting the vehicle.

Further, patterns avoid having to obtain the insulation resistance value for each particular sequence of voltages obtained by the sensor. The system 1 equates the sensor voltages ($x_{i0}$, $x_{i1}$, $x_{i2}$, . . . ; $0 \le i \le n$) with the voltage values ($p_{i0}$, $p_{i1}$, $p_{i2}$, . . . ; $0 \le i \le n$) of the selected pattern. Thus, the possible values of insulation resistance are limited. In this way, the system 1 simplifies obtaining the insulation resistance value.

Additionally, the system 1 offers a variable and easily adaptable performance. By just increasing or decreasing the number of patterns, the system 1 allows modifying accuracy of the insulation resistance value and the time required to obtain it. Increasing the number of provided patterns increases the accuracy of the obtained value but also increases the starting delay, while decreasing the number of provided patterns decreases the starting delay but also decreases the accuracy of the obtained value.

Further, the system 1 assures a safe vehicle start by evaluating the insulation resistance value with respect to a predetermined resistance threshold. The threshold establishes a minimum desirable resistance between the high voltage terminals of the battery and the chassis. Thus, if the obtained value exceeds the threshold, the starting is enabled, and safe start is guaranteed.

The system 1 is also associated with a method for assisting the start of an electrically powered vehicle, wherein the vehicle comprises a battery and a chassis, wherein the method comprises:

g) receiving a sequence of voltage measurements ($x_{i0}$, $x_{i1}$, $x_{i2}$, ...; $0 \leq i \leq n$) measured by a sensor connected between the high voltage terminals of the battery and the chassis;

h) comparing the sequence of voltage measurements ($x_{i0}$, $x_{i1}$, $x_{i2}$, ...; $0 \leq i \leq n$) received from the sensor with previously established voltage patterns (P0, P1, P2, ...), wherein each voltage pattern (P0, P1, P2, ...) is formed by a sequence of voltage values ($p_{i0}$, $p_{i1}$, $p_{i2}$, ...; $0 \leq i \leq n$), and wherein each voltage pattern (P0, P1, P2, ...) is associated to an insulation resistance value (Ri; $0 \leq i \leq n$);

i) selecting the voltage pattern (Pi; $0 \leq i \leq n$) whose voltage values ($p_{i0}$, $p_{i1}$, $p_{i2}$, ...; $0 \leq i \leq n$) are closest to the voltage values of the sequence of voltage measurements ($x_{i0}$, $x_{i1}$, $x_{i2}$, ...; $0 \leq i \leq n$) received from the sensor;

j) establishing the insulation resistance value (Ri; $0 \leq i \leq n$) associated to the selected voltage pattern (P0, P1, P2, ...) as the insulation resistance value of the battery; and k) enabling starting of the vehicle if the insulation resistance value obtained exceeds a predetermined insulation resistance threshold value that ensures insulation of the battery.

The foregoing features and elements may be combined in various combinations without exclusivity, unless expressly indicated otherwise. These features and elements, as well as the operation thereof, will become more apparent in light of the following description and the accompanying drawings. However, it should be understood that the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
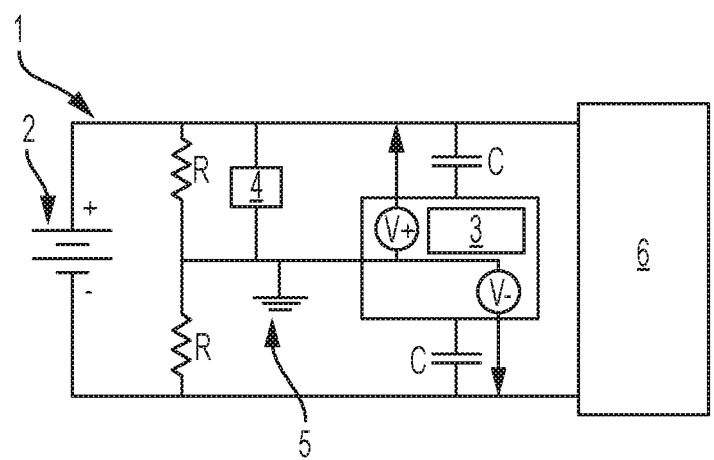
FIG. 1 shows a system for assisting the start of an electrically powered vehicle, when the system is installed in the vehicle.

FIG. 1 shows an electric equivalence of a system 1 for assisting the start of an electrically powered vehicle, when the system 1 is installed in the vehicle. The system 1 comprises a battery 2 for powering the vehicle, and a processing means 3 (e.g., processing circuitry and/or microprocessor). Preferably, when installed, the system 1 may further comprise a pair of resistors R, a sensor 4 connected between the high voltage terminals of the battery 2 and the vehicle chassis 5, and a load 6. The resistors R shown in FIG. 1 are preferably according to the test procedure TP-305-01. The capacitors C are inherent to the load 6, which represents the engine of charger of the electrically powered vehicle. The term "electrically powered vehicle" includes autonomous vehicles, hybrid vehicles, and any other vehicle that is, at least in-part, propelled by an electric motor or other electric propulsion device.

Figure 8:
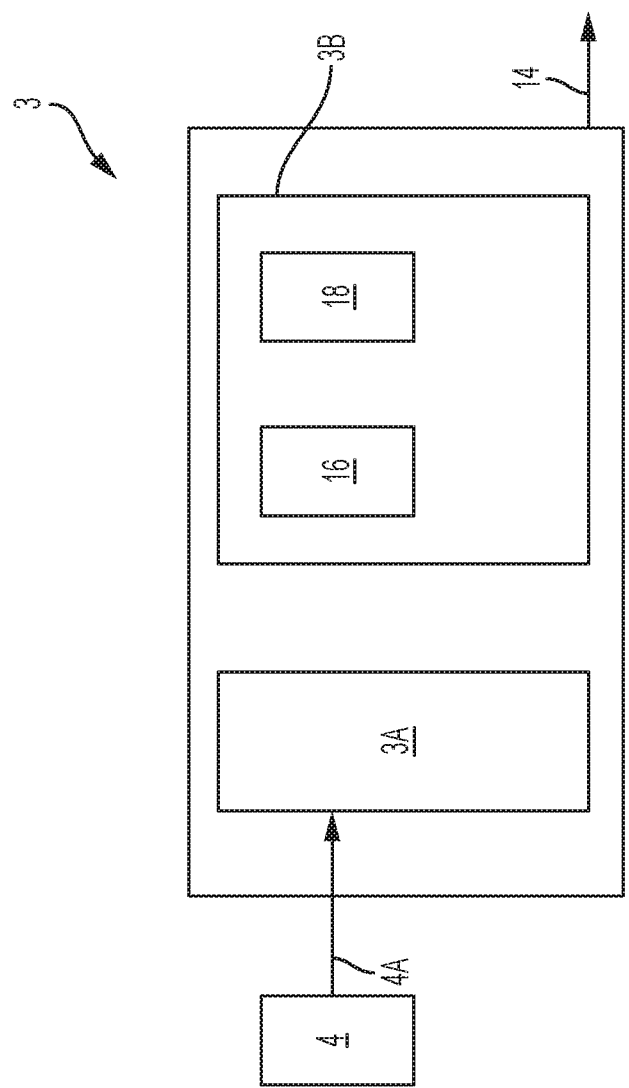
FIG. 8 is a schematic of processing circuitry of the system.

Referring to FIGS. 1 and 8, the processing circuitry 3, or processing circuitry, includes one or more processors 3A (i.e., one illustrated in FIG. 8), and one or more electronic storage mediums 3B (i.e., one illustrated in FIG. 8). The processor 3A may be a microprocessor or other control circuitry such as analog and/or digital circuitry including an application specific integrated circuit (ASIC) for processing data as in known by one with skill in the art. The storage medium 3B of the processing circuitry 3 may be non-volatile memory, such as electrically erasable programmable read-only memory (EEPROM) for storing one or more routines, thresholds, and captured data.

In one embodiment, the processing circuitry 3 is configured to: receive a sequence of voltage measurements by a sensor 4 as a sensory signal (see arrow 4A in FIG. 8), compare the sequence of voltage measurements (i.e., the signal 4A) with pre-established voltage patterns 18, wherein the patterns are representative of an insulation resistance value, select the voltage pattern closest to the sequence of voltage measurements provided by the sensor 4, establish the insulation resistance value associated to the selected voltage pattern, and output a command signal (see arrow 14 in FIG. 8) that enables starting of the vehicle if the insulation resistance value obtained exceeds a predetermined insulation resistance threshold value 16 that ensures insulation of the battery.

Referring to FIG. 8 and in one embodiment, the insulation resistance threshold value 16 is preprogrammed into the storage medium 3B of the processing circuitry 3 and retrieved by the processor 3A. Similarly, the pre-established voltage patterns may be a preprogrammed plurality of voltage patterns stored in the storage medium 3B and retrieved by the processor 3A. The voltage signal 4A is transformed into the command signal 14 by the processor 3A via use of the threshold value 16, the voltage patterns 18, and executed software or computer instructions. The command signal 14 may be a permissive signal. Alternatively, the command signal 14 may prevent starting of the vehicle, and the absence of the signal may permit starting.

In one embodiment, the resistance threshold value 16 takes into account the battery voltage, because the units of the threshold may be "ohm/V" (i.e., insulation resistance over battery voltage). The insulation resistance may be for both battery terminals (i.e., positive and negative).

Figure 2:
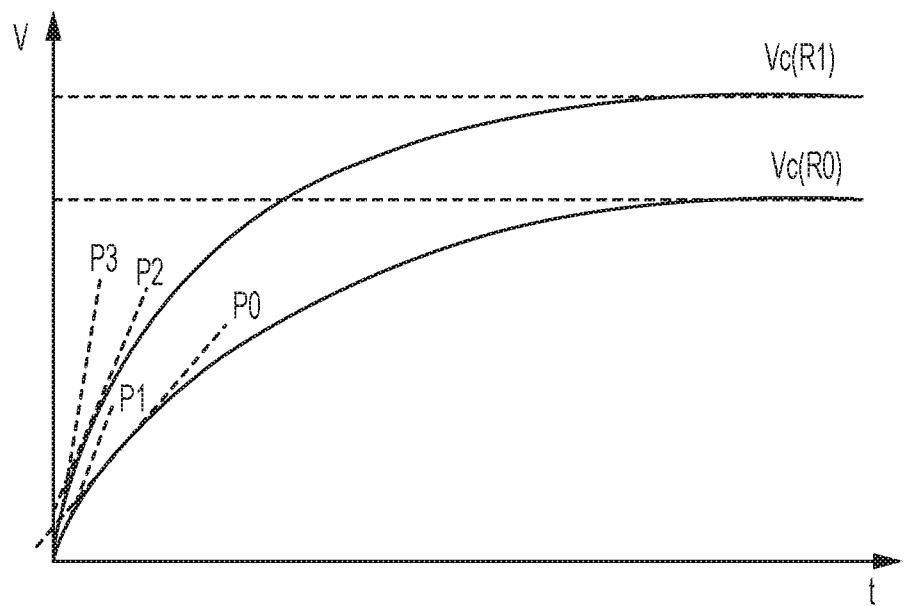
FIG. 2 shows a graphic that represents the temporal voltage behavior of two different sensor measurements, each one corresponding to an insulation resistance value. Also, the figure shows a set of voltage patterns associated to these insulation resistance values.

FIG. 2 shows the potential variation of two different measurements provided by the sensor 4 that senses the resistance between the high voltage terminals of the battery 2 and the chassis 5 (i.e., ground) of the vehicle. Each curve is formed by a sequence of voltage measurements, which, as shown, have a considerable variation at an initial measurement stage, and which stabilize after a certain period of time.

Figure 3:
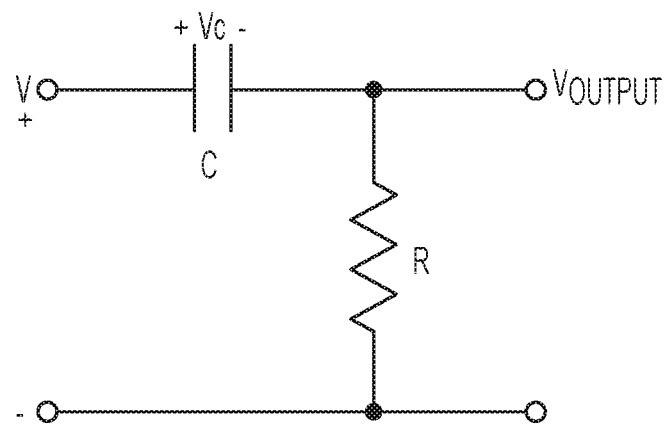
FIG. 3 shows the electric equivalent circuit of the temporal voltage behavior shown in FIG. 2 corresponding to the voltage values received by the sensor for each battery terminal.

The voltage values of the sensor 4 correspond to a resistor-capacitor (RC) circuit of the kind shown in FIG. 3. Thus, in order to provide a reliable measurement of the insulation resistance, stabilization of the curve is initially achieved.

Curves shown in FIG. 2 stabilize at different voltage levels; thus, each curve is associated to a different insulation resistance value, where a first curve Vc (R0) has an insulation resistance value of R0 and a second curve Vc (R1) has an insulation resistance value of R1.

FIG. 2 also shows a plurality of voltage patterns 18 (P0, P1, P2, and P3). Each pattern is formed by a sequence of voltage values, which are representative of the initial phase of the temporal variation of the potential measured by the sensor 4 between the high voltage terminals of the battery 2 and the chassis 5. This initial phase usually extends approximately over 10 to 40% of the stabilization time of the potential, preferably over 25% of the stabilization time.

Each sensor measurement, formed by a sequence of voltage measurements, will be compared with each sequence of voltage values that form each voltage pattern. Thus, each pattern represents a possible sensor measurement and, in consequence, a possible result of insulation resistance value. Due to the voltage patterns, the possible sensor measurements are limited and, in the same way, may be standardized. The same occurs with the insulation resistance values since these values are determined by the selection of the voltage pattern. In this way, the system 1 simplifies obtaining the insulation resistance value.

In the example shown in FIG. 2, patterns P0 and P1 represent the first curve Vc (R0) and patterns P2 and P3 represent the second curve Vc (R1). Thus, when comparing the voltage values of the first curve Vc (R0) with the patterns 18 (P0, P1, P2, and P3), pattern P0 will be selected for being the closest one, while, when comparing the voltage values of the second curve Vc (R1) with the voltage patterns 18 (P0, P1, P2, and P3), pattern P2 will be selected.

According to one embodiment, once the pattern is selected, the insulation resistance value is obtained. In the represented example, patterns P0 and P1 are associated to R0 since the voltage values of these patterns are more similar to the voltage values of the first curve Vc (R0), and voltage patterns P2 and P3 are associated to R1 since the voltage values of these voltage patterns are more similar to the voltage values of the second curve Vc (R1). Thus, if P0 or P1 were selected, the insulation resistance value obtained would be R0 and, if P2 or P3 were selected, the insulation resistance value obtained would be R1.

For the above mentioned case, the P0 selection results in an insulation resistance value of R0 and the P2 selection results in an insulation resistance value of R1.

In this way, the system 1 allows determining the insulation resistance value before the sensor reaches the stabilization state. The insulation resistance value is determined by the patterns, which comprise voltage values of the initial ramp of the voltage curves. Preferably, the initial ramp extends approximately over 10 to 40% of the stabilization time of the potential, preferably over 25% of the stabilization time.

Thus, system 1 can predict the insulation resistance value associated to sensor measurements from the initial values captured by the sensor.

According to a preferred embodiment(s), the processing circuitry of the system is further configured to obtain a plurality of voltage patterns, which are representative of temporal variation of the potential between the high voltage terminals of the battery and the chassis for a plurality of predetermined values of load and insulation resistance. Therefore, the system 1 is capable of generating and using the voltage patterns obtained by the system itself.

Preferably, the processing circuitry is configured to generate a decision tree from a first set of values formed by theoretical temporal variation of potential between the high voltage terminals of the battery and the chassis and a second set of values formed by empirical temporal variation of potential measured by a sensor connected between the high voltage terminals of the battery and the chassis. In another embodiment, the first set of values may be pre-measured values stored in any memory for being used by the processing circuitry 3.

Figure 4:
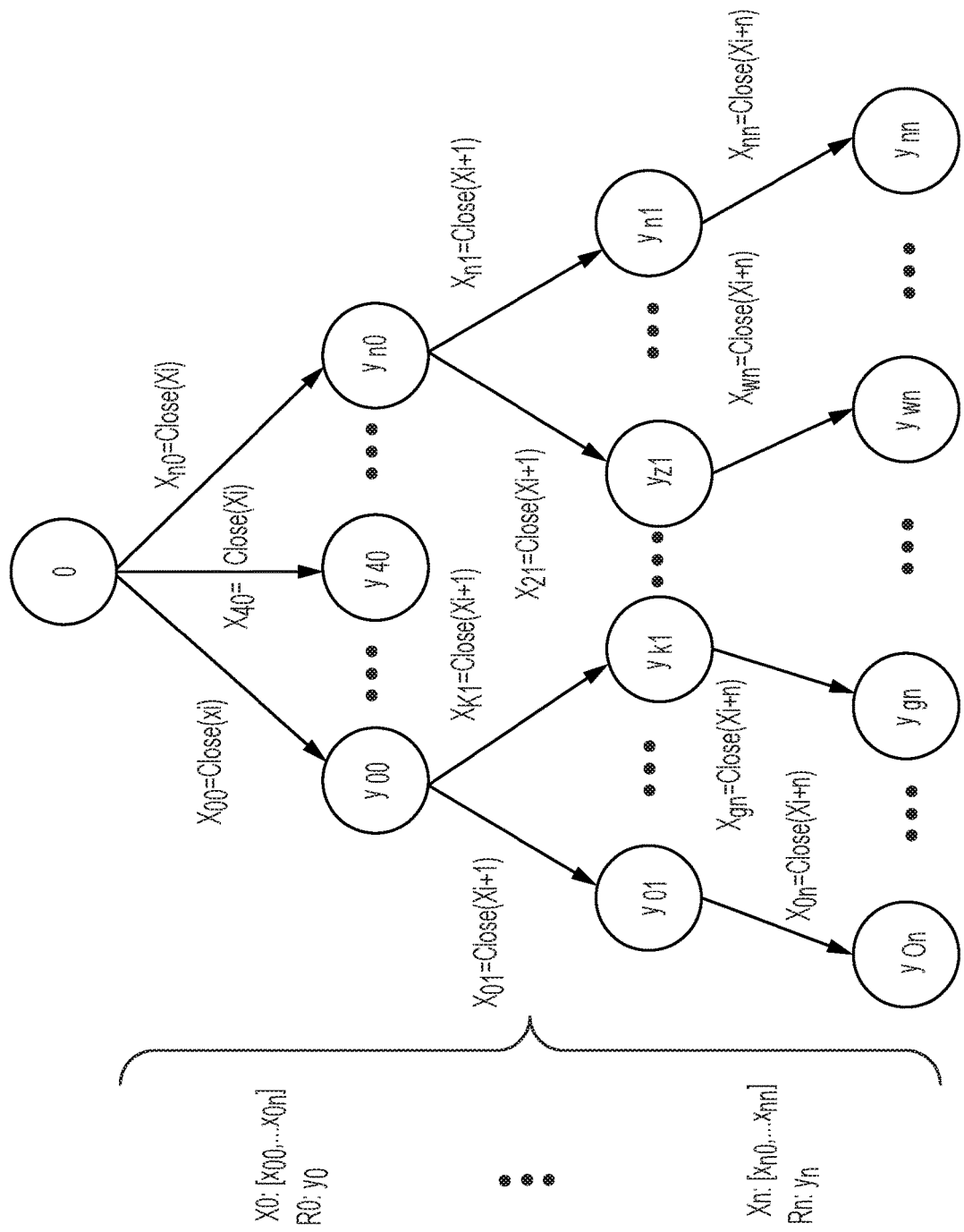
FIG. 4 shows an illustration of the learning mode of a decision tree, which is generated, according to a preferred embodiment of the invention, for comparing the sequence of voltage measurements received from the sensor with the voltage values of each one of the voltage patterns.

FIG. 4 shows a representation of a decision tree in learning mode. In this mode, the decision tree is trained from theoretical and empirical sensor values to obtain the corresponding insulation resistance value in function of the established patterns.

Figure 5:
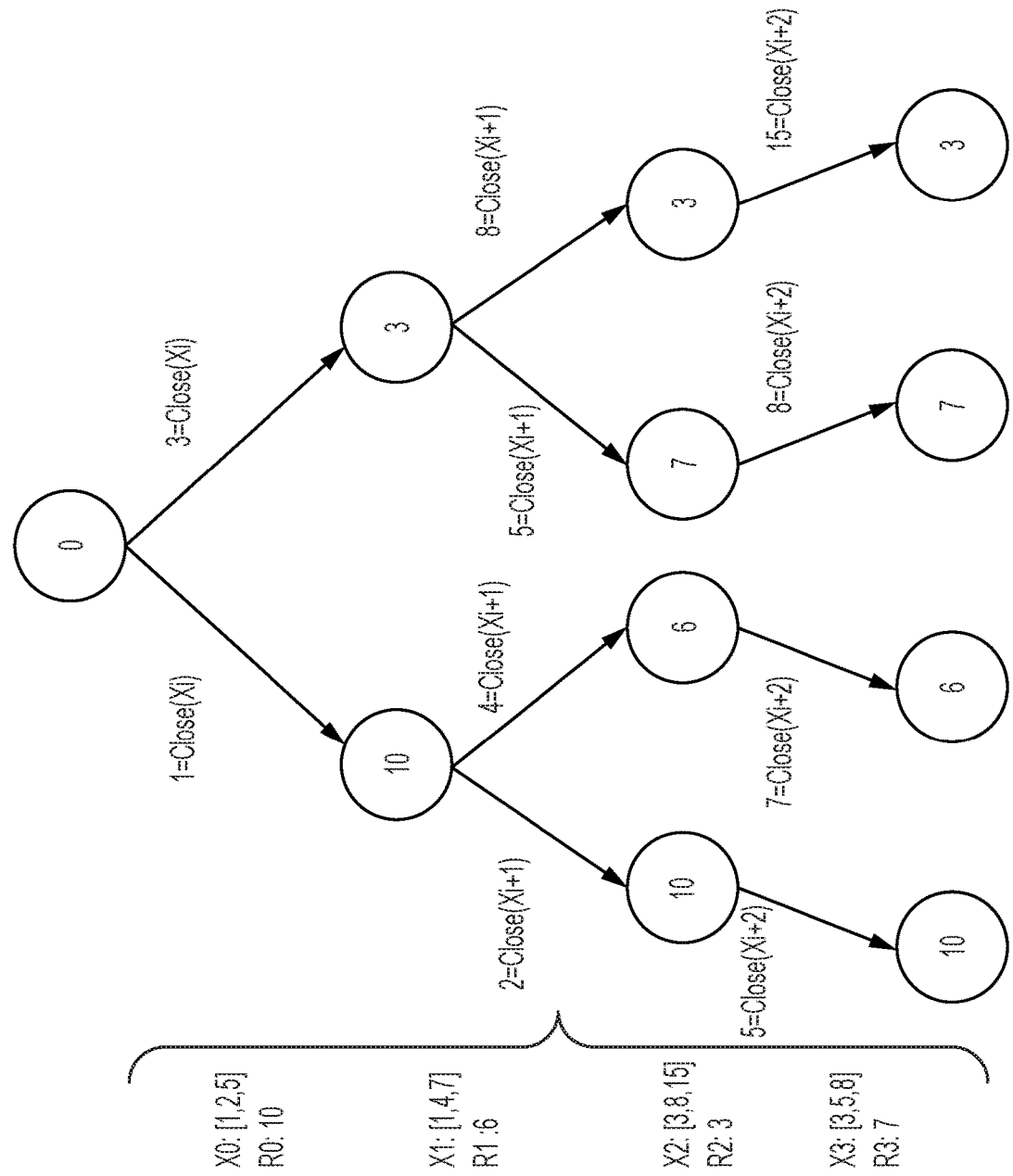
FIG. 5 shows an example of application of the learning mode of the decision tree shown in FIG. 4.

As shown in FIGS. 4 and 5, patterns 18 (P0, P1, P2, ...) will be generated from the sequences (X0, X1, X2 ...) of voltage measurements ($x_{i0}$, $x_{i1}$, $x_{i2}$, ...; $0 \leq i \leq n$) received from the sensor and the insulation resistance value (R0, R1, R2 ...) corresponding to each sensor measurement. In this manner, patterns are associated to an insulation resistance value such that this insulation resistance value will be known by selecting a pattern.

As shown in FIG. 5, from each sequence (X0, X1, X2 ...) of voltage measurements ($x_{i0}$, $x_{i1}$, $x_{i2}$, ...; $0 \leq i \leq 2$) and its correspondent insulation resistance (R0, R1, R2 ...), a pattern 18 (P0, P1, P2, ...) and an insulation resistance value will be created. That is, X0=[1, 2, 5]; R0=10→P0=[1, 2, 5]; R0=10
X1=[1, 4, 7]; R1=6→P1=[1, 4, 7]; R1=6
X2=[3, 8, 15]; R2=3→P2=[3, 8, 15]; R2=3
X3=[3, 5, 8]; R3=7→P3=[3, 5, 8]; R3=7

Once the decision tree is created by theoretical values of both the sensor values and the insulation resistance, the tree is trained with empirical values until a desired error is obtained. This error depends on the size of the tree, the quality of the learning process and some other factors. The size of the tree will be limited since patterns only correspond to the initial ramp of the sensor voltage curves.

Once the decision tree is generated, it can be applied when comparing the sequence of voltage measurements ($x_{i0}$, $x_{i1}$, $x_{i2}$, ...; $0 \leq i \leq n$) received from the sensor with each one of the voltage patterns 18 (P0, P1, P2, ...).

Figure 6:
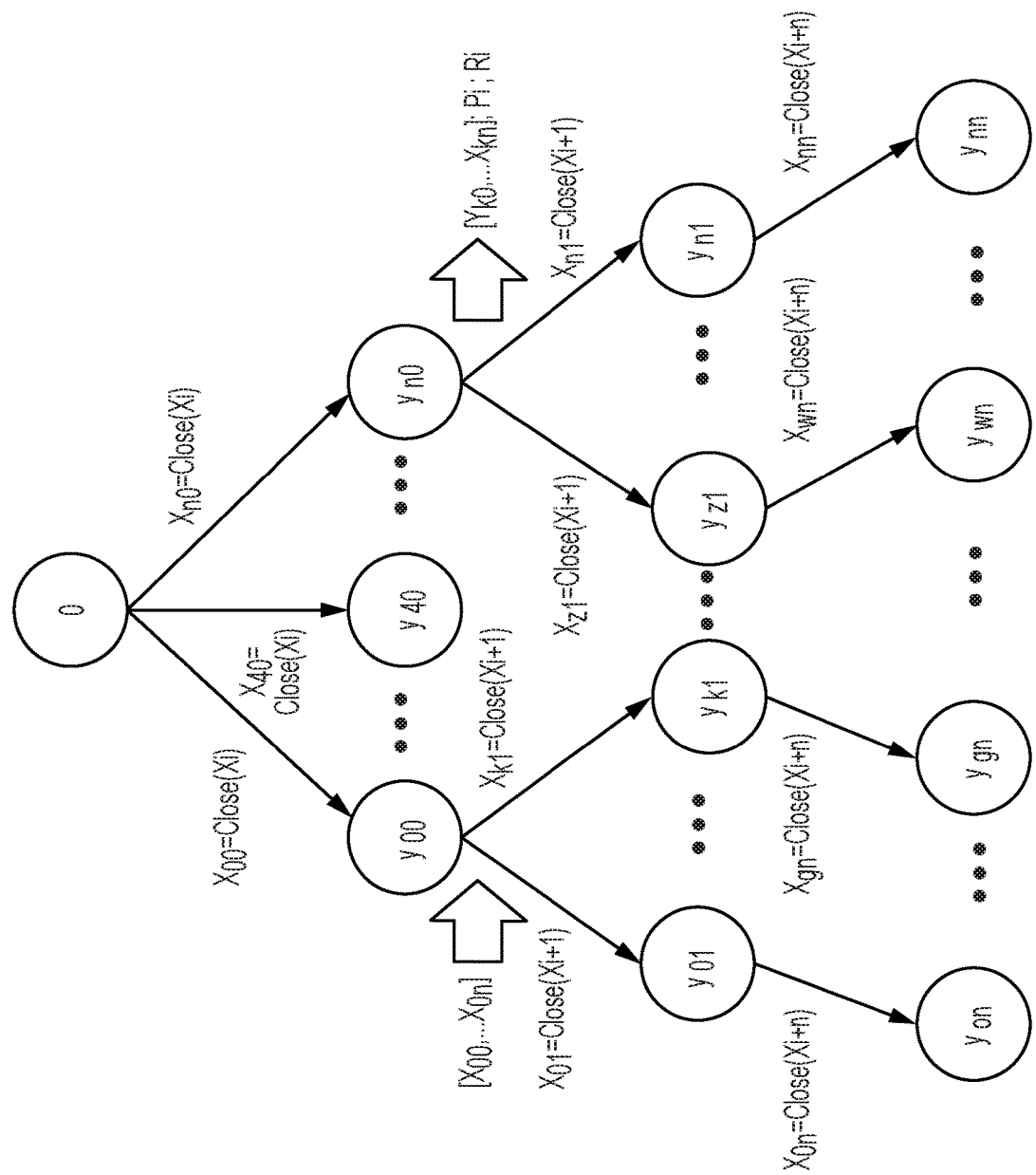
FIG. 6 shows an illustration of the execution mode of the decision tree generated according to a preferential embodiment of the present disclosure.

FIG. 6 shows a representation of a decision tree in execution mode. In this mode, the system is capable of selecting the closest pattern to the sensor voltage measures and, as a result, of obtaining the insulation resistance value.

Figure 7:
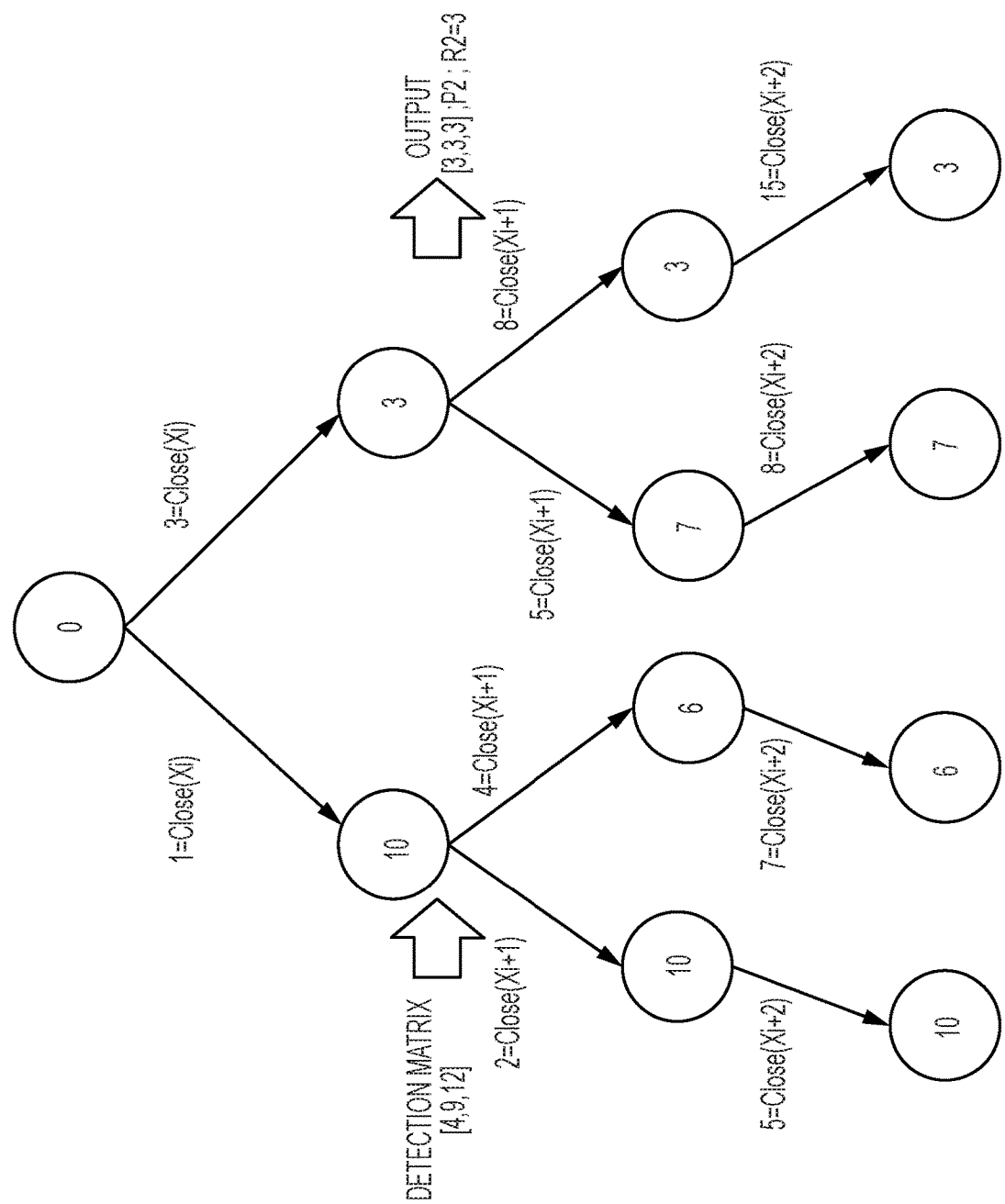
FIG. 7 shows an example of application of the execution mode of the decision tree shown in FIG. 5.

FIG. 7 shows an example of the execution mode of the decision tree of FIG. 5. The sequence of voltage measurements received by the sensor [4, 9 12] are compared to the values of the branches of the tree. The values of the branches correspond to the values of the patterns. Thus, [4, 9, 12] is compared to P0=[1, 2, 5], P1=[1, 4, 7], P2=[3, 8, 15] and P3=[3, 5, 8]. After that, P2 will be selected for being the closest and the insulation resistance value associate will be easily obtained, R=3.

According to a preferred embodiment, the voltage measurements ($x_{i0}, x_{i1}, x_{i2}, \ldots$; $0 \leq i \leq n$) and the voltage values ($p_{i0}, p_{i1}, p_{i2}, \ldots$; $0 \leq i \leq n$) correspond to instantaneous values of voltage.

Alternatively, in another preferred embodiment, the voltage measurements ($x_{i0}, x_{i1}, x_{i2}, \ldots$; $0 \leq i \leq n$) and the voltage values ($p_{i0}, p_{i1}, p_{i2}, \ldots$; $0 \leq i \leq n$) correspond to the derivative of the instantaneous values of voltage, averages of instantaneous values of voltage, or the root mean square (RMS) of instantaneous values of voltage.

Once the insulation resistance value is obtained, the processor 3A of the processing circuitry 3 compares the value with the predetermined insulation resistance threshold value 16. In one embodiment, the predetermined insulation resistance threshold value is in the range of 1 Ω/V to 2000 Ω/V, and preferably between 5 Ω/V to 1000 Ω/V. This predetermined insulation resistance threshold value 16 ensures the battery insulation. Thus, if the insulation resistance value obtained exceeds the predetermined insulation resistance threshold value 16, the system 1 ensures insulation of the battery and, in consequence, a safe start of the vehicle.

In another embodiment, the system may utilize a plurality of different resistance thresholds. For example, a critical resistance threshold that operates to disable the start of the vehicle. The critical resistance threshold range may be less than 500 Ω/V, with an optimal range of less than 300 Ω/V. A less restrictive resistance threshold may operate to merely warn of a low insulation resistance. The less restrictive resistance threshold range may be between 300 Ω/V to 750 Ω/V, and optimally between 300 Ω/V to 500 Ω/V.

In operation, the sensor 4 measures voltage between the chassis and the battery terminal during the initial phase of the sensor measurement (i.e., previous to stabilization). The system 1 then compares the sensor results (i.e., during the initial phase) with predetermined values stored in the processing circuitry 3. The system 1 may then predict the insulation resistance, and starting of the vehicle is enabled and/or disabled in accordance with the insulation resistance value.

In parallel to this operation, the sensor 4 may continue to measure the actual voltage to obtain the actual insulation resistance (i.e., during the stabilization phase). That is, with the measured actual voltage, the system 1 may establish an actual insulation resistance. The actual insulation resistance is then compared to the predicted insulation resistance. If the actual insulation resistance is similar (i.e., less than about 5% to 10%) to the predicted insulation resistance, the system 1 may:

1) Be maintained without modification, or
2) Change the pattern stored with the incorrect predicted insulation resistance with the new pattern obtained with the actual measurement, and modify the decision tree taking into account the change of patterns.
3) Add the new pattern to the system and modify the decision tree taking into account the new pattern.

If the actual insulation resistance is dissimilar (i.e., more than about 5% to 10%), the system may:

1) Change the pattern stored with the incorrect predicted insulation resistance with the new pattern obtained with the actual measurement, and modify the decision tree taking into account the change of patterns, or
2) Add the new pattern to the system and modify the decision tree taking into account the new pattern.

Figure 9:
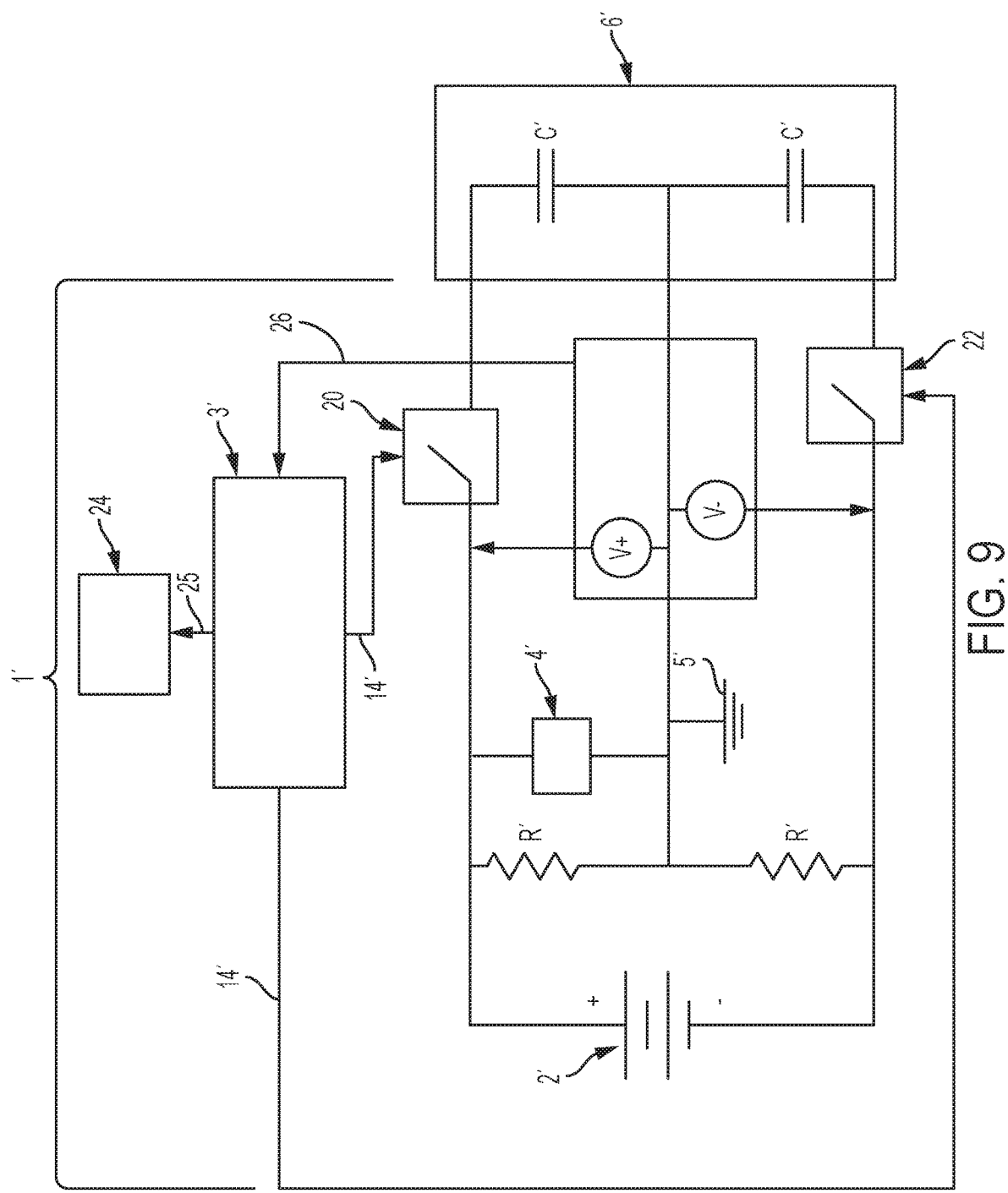
FIG. 9 shows a second embodiment of a system for controlling the electrical energizing of a load of a vehicle when the system is installed in the vehicle.

FIG. 9 illustrates a second embodiment of the system illustrated in FIG. 1, wherein like elements have like identifying numerals, or letters, except for the addition of a prime symbol suffix. The system 1' is configured to control, and/or isolate, the electrical energization of a load 6' relative to starting of the vehicle (as previously described), or during operation of the vehicle. The system 1' includes a battery 2', processing circuitry 3', a pair of resistors R', and a sensor 4'. The system 1' interacts with the electrical load 6' and a vehicle chassis 5'. Capacitors C' are inherent to the load 6' that, in one example, may be an engine. In one example, operation of the vehicle may constitute running of a combustion engine (i.e., the load 6'). In another embodiment, the vehicle may be an autonomous vehicle propelled by at least one electric motor, and the system 1' may interact with the electric motor(s). This interaction may be deenergizing the electric motor(s).

In one embodiment, the system 1' may further include two isolation devices 20, 22 (e.g., relays) each adapted to receive a command signal 14' from the processing circuitry 3' that effects isolating the battery 2' from the load 6' if the processing circuitry 3' determines that the insulation resistance value (see signal 26 indicative of the value in FIG. 9) is equal to, or below, the predetermined insulation resistance threshold value. This isolation may occur to prevent starting of the vehicle as previously described, and/or may cause the load 6' to be deenergized while operating. It is contemplated and understood that the two isolation devices 20, 22 may be a single device constructed to open both the positive and negative sides of the battery 2'.

In one example, an autonomous, electric, vehicle may be operating (e.g., moving down a road) and the processing circuitry 3' may determine that the insulation resistance value is equal to, or below, the predetermined insulation resistance threshold value. The command signal 14' may then be sent to the isolation devices 20, 22 to safely shutdown operation of the vehicle. It is further contemplated and understood that the isolation devices 20, 22 may be applied to prevent starting of the vehicle, and another means may be applied (electronic control circuitry system) to shut down the vehicle in a scenario where the vehicle is already started and/or driving.

In at least this scenario, the system 1' may further include a notice device 24 (e.g., audible and/or visual) configured to notify an occupant, or driver, of the vehicle of the insulation resistance value condition. Specifically, the processing circuitry 3' may output a notice signal 25 to the notice device 24 that provides the driver an opportunity to shut down the vehicle. Yet further, the notice device 24 may further provide notice to the driver that the system 1' will automatically shut down the vehicle upon the expiration of a time period or the occurrence of an event. The various functions described above may be implemented or supported by a computer program that is formed from computer readable program codes, and that is embodied in a computer readable medium. Computer readable program codes may include source codes, object codes, executable codes, and others. Computer readable mediums may be any type of media capable of being accessed by a computer, and may include Read Only Memory (ROM), Random Access Memory (RAM), a hard disk drive, a compact disc (CD), a digital video disc (DVD), or other non-transitory forms.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Terms used herein such as component, application, module, system, and the like are intended to refer to a computer-related entity, either hardware, a combination of hardware and software, or software execution. By way of example, an application may be, but is not limited to, a process running on a processor, a processor, an object, an executable, a thread of execution, a program, and/or a computer. An application running on a server and the server, may be a component. One or more applications may reside within a process and/or thread of execution and an application may be localized on one computer and/or distributed between two or more computers.

While the present disclosure is described with reference to the figures, it will be understood by those skilled in the art that various changes may be made and equivalents may be substituted without departing from the spirit and scope of the present disclosure. In addition, various modifications may be applied to adapt the teachings of the present disclosure to particular situations, applications, and/or materials, without departing from the essential scope thereof. The present disclosure is thus not limited to the particular examples disclosed herein, but includes all embodiments falling within the scope of the appended claims.

What is claimed is:

1. A system for deenergizing an electrical load of an electrically powered vehicle including a battery, the system comprising:
   processing circuitry configured to:
   a) receive a sensory signal including an initial ramp state and a stabilization state, the sensory signal indicative of a sequence of voltage measurements ($x_{i0}, x_{i1}, x_{i2}, \ldots ; 0 \leq i \leq n$) during the initial ramp state,
   b) compare the sequence of voltage measurements ($x_{i0}, x_{i1}, x_{i2}, \ldots ; 0 \leq i \leq n$) with a previously established plurality of voltage patterns (P0, P1, P2, . . . ), wherein each voltage pattern of the plurality of voltage patterns (P0, P1, P2, . . . ) is formed by a sequence of voltage values ($p_{i0}, p_{i1}, p_{i2}, \ldots ; 0 \leq i \leq n$), and wherein each voltage pattern of the plurality of voltage patterns (P0, P1, P2, . . . ) is associated to an insulation resistance value ($Ri; 0 \leq i \leq n$),
   c) select a voltage pattern ($Pi; 0 \leq i \leq n$) of the plurality of voltage patterns whose voltage values ($p_{i0}, p_{i1}, p_{i2}, \ldots ; 0 \leq i \leq n$) are closest to the voltage values of the sequence of voltage measurements ($x_{i0}, x_{i1}, x_{i2}, \ldots ; 0 \leq i \leq n$) received from the sensor,
   d) establish the insulation resistance value ($Ri; 0 \leq i \leq n$) associated to the selected voltage pattern (P0, P1, P2, . . . ) as the insulation resistance value of the battery, and
   e) deenergize the electrical load if the insulation resistance value obtained is equal to, or below, a predetermined insulation resistance threshold value representative of ensuring electrical insulation of the battery.

2. The system set forth in claim 1, wherein the load is indicative of vehicle start, and processing circuitry is configured to enable electrical energization of the load.

3. The system set forth in claim 1, wherein the load is an electric motor adapted to propel the vehicle, and the processing circuitry is configured to shut down the vehicle while being propelled by the electric motor.

4. The system set forth in claim 3, further comprising:
   a notice device adapted to receive a signal from the processing circuitry indicative of the insulation resistance value being equal to, or below, a predetermined insulation resistance threshold value.

5. The system set forth in claim 1, wherein the sensory signal is transformed by the processing circuitry and into a command signal outputted by the processing circuitry to effect the electrical energization of the load.

6. The system set forth in claim 1, wherein the initial ramp state extends over a period that is less than forty percent of a stabilization period associated with a voltage curve of a sensor configured to generate the sensory signal.

7. The system set forth in claim 1, wherein the processing circuitry includes a processor and a non-transitory storage medium, and the plurality of voltage patterns (P0, P1, P2, . . . ) and the predetermined insulation resistance threshold value are preprogrammed into the non-transitory storage medium.

8. A system for assisting the start of an electrically powered vehicle, comprising:
   a battery for powering the vehicle; and
   processing circuitry configured to:
   a) receive a sequence of voltage measurements ($x_{i0}, x_{i1}, x_{i2}, \ldots ; 0 \leq i \leq n$) by a sensor connected between the high voltage terminals of the battery and a vehicle chassis,
   b) compare the sequence of voltage measurements ($x_{i0}, x_{i1}, x_{i2}, \ldots ; 0 \leq i \leq n$) received from the sensor with a preprogrammed plurality of voltage patterns (P0, P1, P2, . . . ), wherein each voltage pattern of the plurality of voltage patterns (P0, P1, P2, . . . ) is formed by a sequence of voltage values ($p_{i0}, p_{i1}, p_{i2}, \ldots ; 0 \leq i \leq n$), and wherein each voltage pattern of the preprogrammed plurality of voltage patterns (P0, P1, P2, . . . ) is associated to an insulation resistance value ($Ri; 0 \leq i \leq n$),
   c) select a voltage pattern ($Pi; 0 \leq i \leq n$) of the preprogrammed plurality of voltage patterns whose voltage values ($p_{i0}, p_{i1}, p_{i2}, \ldots ; 0 \leq i \leq n$) are closest to the voltage values of the sequence of voltage measurements ($x_{i0}, x_{i1}, x_{i2}, \ldots ; 0 \leq i \leq n$) received from the sensor,
   d) establish the insulation resistance value ($Ri; 0 \leq i \leq n$) associated to the selected voltage pattern of the preprogrammed plurality of voltage patterns (P0, P1, P2, . . . ) as the insulation resistance value of the battery, and
   e) enable starting of the vehicle if the insulation resistance value obtained exceeds a predetermined insulation resistance threshold value that ensures insulation of the battery, wherein the predetermined insulation resistance threshold value ranges from 1 Ω/V to 2000 Ω/V.

9. The system according to claim 8, wherein the processing circuitry is further configured to:
f) obtain the preprogrammed plurality of voltage patterns representative of temporal variation of the potential between the high voltage terminals of the battery and the chassis for a plurality of predetermined values of load and insulation resistance.

10. The system according to claim 9, wherein the processing circuitry is configured to generate a decision tree from a first set of values formed by theoretical temporal variation of potential between the high voltage terminals of the battery and the chassis, and a second set of values formed by empirical temporal variation of potential measured by a sensor connected between the high voltage terminals of the battery and the chassis.

11. The system according to claim 10, wherein the processing means are configured to generate the decision tree by a subset of the first and the second set of values, and wherein the number of values of any of the subset determines the number of levels of the decision tree.

12. The system according to claim 10, wherein the processing circuitry is configured to apply the generated decision tree when comparing the sequence of voltage measurements $(x_{i0}, x_{i1}, x_{i2}, \ldots; 0 \leq i \leq n)$ received from the sensor with the preprogrammed plurality of voltage patterns (P0, P1, P2, ...).

13. The system according to claim 8, wherein the voltage measurements $(x_{i0}, x_{i1}, x_{i2}, \ldots; 0 \leq i \leq n)$ and the voltage values $(p_{i0}, p_{i1}, p_{i2}, \ldots; 0 \leq i \leq n)$ correspond to one of instantaneous values of voltage, derivatives of instantaneous values of voltage, averages of instantaneous values of voltage, and RMS of instantaneous values of voltage.

14. The system according to claim 8, wherein the predetermined insulation resistance threshold value ranges from 5 Ω/V to 1000 Ω/V.

15. A method for assisting the energization control of a load of an electrically powered vehicle, wherein the electrically powered vehicle comprises a battery and a chassis, the method comprising:
receiving a sensory signal by a processor, the sensory signal indicative of a sequence of voltage measurements $(x_{i0}, x_{i1}, x_{i2}, \ldots; 0 \leq i \leq n)$ measured by a sensor connected between high voltage terminals of the battery and the chassis;
comparing the sequence of voltage measurements $(x_{i0}, x_{i1}, x_{i2}, \ldots; 0 \leq i \leq n)$ with a plurality of voltage patterns (P0, P1, P2, ...) by the processor and preprogrammed into a non-transitory storage medium, wherein each voltage pattern of the plurality of voltage patterns (P0, P1, P2, ...) is formed by a sequence of voltage values $(p_{i0}, p_{i1}, p_{i2}, \ldots; 0 \leq i \leq n)$, and wherein each voltage pattern of the plurality of voltage patterns (P0, P1, P2, ...) is associated to an insulation resistance value (Ri; 0≤i≤n);
selecting by the processor the voltage pattern (Pi; 0≤i≤n) of the plurality of voltage patterns whose voltage values $(p_{i0}, p_{i1}, p_{i2}, \ldots; 0 \leq i \leq n)$ are closest to the voltage values of the sequence of voltage measurements $(x_{i0}, x_{i1}, x_{i2}, \ldots; 0 \leq i \leq n)$;
establishing by the processor the insulation resistance value (Ri; 0≤i≤n) of the selected voltage pattern (P0, P1, P2, ...) as the insulation resistance value of the battery; and
if the vehicle is not yet started, transforming the sensory signal into a command signal outputted by the processor for enabling starting of the electrically powered vehicle if the processor determines that the insulation resistance value obtained exceeds an insulation resistance threshold value preprogrammed into the storage medium and that ensures insulation of the battery.

16. The method according to claim 15, further comprising:
obtaining a plurality of voltage patterns representative of temporal variation of the potential between the high voltage terminals of the battery and the chassis for a plurality of predetermined values of load and insulation resistance.

17. The method set forth in claim 15, wherein the steps are performed by a program code stored in the storage medium and executed by the processor.

18. The method set forth in claim 15, further comprising:
continue to measure the sequence of voltage measurements to establish the insulation resistance during a stabilization state of the sensor, wherein the sensor includes an initial ramp state followed by the stabilization state.

19. The method set forth in claim 18, further comprising:
comparing the insulation resistance to a predicted insulation resistance; and
determining if the insulation resistance is within a range of five percent to ten percent of the predicted insulation resistance;
if the insulation resistance is within the range then perform one of the following:
maintain current operation,
change a current predicted insulation resistance pattern stored in the storage medium with a succeeding insulation resistance pattern indicative of the sequence of voltage measurements and modify a decision tree stored in the storage medium and applied by the processor, and
add the succeeding insulation resistance pattern to the storage medium and modify the decision tree accordingly.

20. The method set forth in claim 19, further comprising:
if the insulation resistance falls outside the range, then perform one of the following:
change a current predicted insulation resistance pattern stored in the storage medium with a succeeding insulation resistance pattern indicative of the sequence of voltage measurements and modify a decision tree stored in the storage medium and applied by the processor, and
add the succeeding insulation resistance pattern to the storage medium and modify the decision tree accordingly.

* * * * *